US006967366B2

(12) United States Patent
Janesky et al.

(10) Patent No.: US 6,967,366 B2
(45) Date of Patent: Nov. 22, 2005

(54) MAGNETORESISTIVE RANDOM ACCESS MEMORY WITH REDUCED SWITCHING FIELD VARIATION

(75) Inventors: Jason A. Janesky, Mesa, AZ (US); Bradley N. Engel, Chandler, AZ (US); Jon M. Slaughter, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/648,466

(22) Filed: Aug. 25, 2003

(65) Prior Publication Data

US 2005/0045929 A1 Mar. 3, 2005

(51) Int. Cl.[7] .............................................. H01L 29/76
(52) U.S. Cl. ...................................... 257/295; 257/16
(58) Field of Search ........................... 257/295, 16, 30, 257/55, 421, 427, 425

(56) References Cited

U.S. PATENT DOCUMENTS

| | | | |
|---|---|---|---|
| 3,163,853 A | 12/1964 | Belson | |
| 3,448,438 A | 6/1969 | Hansen et al. | |
| 3,573,760 A | 4/1971 | Chañg et al. | |
| 3,638,199 A | 1/1972 | Kolankowsky et al. | |
| 3,707,706 A | 12/1972 | Kefalas | |
| 3,913,080 A | 10/1975 | Leo et al. | |
| 4,103,315 A | 7/1978 | Hempstead et al. | |
| 4,351,712 A | 9/1982 | Cuomo et al. | |
| 4,356,523 A | 10/1982 | Yeh | |
| 4,455,626 A | 6/1984 | Lutes | |
| 4,556,925 A | 12/1985 | Suenaga et al. | |
| 4,663,685 A | 5/1987 | Tsang | |
| 4,719,568 A | 1/1988 | Carrubba et al. | |
| 4,731,757 A | 3/1988 | Daughton et al. | |
| 4,751,677 A | 6/1988 | Daughton et al. | |
| 4,754,431 A | 6/1988 | Jenson | |
| 4,780,848 A | 10/1988 | Daughton et al. | |
| 4,825,325 A | 4/1989 | Howard | |
| 4,884,235 A | 11/1989 | Thiele | |
| 5,039,655 A | 8/1991 | Pisharody | |
| 5,075,247 A | 12/1991 | Matthews | |
| 5,159,513 A | 10/1992 | Dieny et al. | |
| 5,173,873 A | 12/1992 | Wu et al. | |

(Continued)

FOREIGN PATENT DOCUMENTS

DE 43 27 458 6/1993

(Continued)

OTHER PUBLICATIONS

Pohm et al., "Analysis of 0.1 to 0.3 Micron Wide, Ultra Dense GMR Memory Elements," IEEE Transactions on Magnetics, Bd. 30, Nr. 6, Nov. 1994, 4650-4652.

(Continued)

*Primary Examiner*—David Nelms
(74) *Attorney, Agent, or Firm*—Ingrassia, Fisher & Lorenz, P.C.

(57) ABSTRACT

An array of multi-state, multi-layer magnetic memory devices (10) wherein each memory device comprises a nonmagnetic spacer region (22) and a free magnetic region (24) positioned adjacent to a surface of the nonmagnetic spacer region, the free magnetic region including a plurality of magnetic layers (36,34,38), wherein the magnetic layer (36) in the plurality of magnetic layers positioned adjacent to the surface of the nonmagnetic spacer region has a thickness substantially greater than a thickness of each of the magnetic layers (34,38) subsequently grown thereon wherein the thickness is chosen to improve the magnetic switching variation so that the magnetic switching field for each memory device in the array of memory devices is more uniform.

12 Claims, 2 Drawing Sheets

U.S. PATENT DOCUMENTS

| | | |
|---|---|---|
| 5,258,884 A | 11/1993 | Howard et al. |
| 5,268,806 A | 12/1993 | Goubau et al. |
| 5,284,701 A | 2/1994 | Hamon |
| 5,285,339 A | 2/1994 | Chen et al. |
| 5,301,079 A | 4/1994 | Cain et al. |
| 5,329,486 A | 7/1994 | Lage |
| 5,343,422 A | 8/1994 | Kung et al. |
| 5,346,302 A | 9/1994 | Ryu |
| 5,347,485 A | 9/1994 | Taguchi et al. |
| 5,348,894 A | 9/1994 | Gnade et al. |
| 5,349,302 A | 9/1994 | Cooper |
| 5,361,226 A | 11/1994 | Taguchi et al. |
| 5,375,082 A | 12/1994 | Katti et al. |
| 5,396,455 A | 3/1995 | Brady et al. |
| 5,398,200 A | 3/1995 | Mazure et al. |
| 5,408,377 A | 4/1995 | Gurney et al. |
| 5,420,819 A | 5/1995 | Pohm |
| 5,432,734 A | 7/1995 | Kawano et al. |
| 5,442,508 A | 8/1995 | Smith |
| 5,448,515 A | 9/1995 | Fukami et al. |
| 5,452,243 A | 9/1995 | Ansel et al. |
| 5,468,985 A | 11/1995 | Harima |
| 5,475,825 A | 12/1995 | Yonezawa et al. |
| 5,477,842 A | 12/1995 | Maruyama et al. |
| 5,496,759 A | 3/1996 | Yue et al. |
| 5,498,561 A | 3/1996 | Sakuma et al. |
| 5,528,440 A | 6/1996 | Fontana et al. |
| 5,534,355 A | 7/1996 | Okuno et al. |
| 5,534,793 A | 7/1996 | Nasserbakht |
| 5,541,868 A | 7/1996 | Prinz |
| 5,567,523 A | 10/1996 | Rosenblum et al. |
| 5,569,617 A | 10/1996 | Yeh et al. |
| 5,585,986 A | 12/1996 | Parkin |
| 5,587,943 A | 12/1996 | Torok et al. |
| 5,617,071 A | 4/1997 | Daughton |
| 5,636,093 A | 6/1997 | Gijs et al. |
| 5,640,343 A | 6/1997 | Gallagher et al. |
| 5,650,958 A | 7/1997 | Gallagher et al. |
| 5,659,499 A | 8/1997 | Chen et al. |
| 5,661,062 A | 8/1997 | Prinz |
| 5,673,162 A | 9/1997 | Saito |
| 5,699,293 A | 12/1997 | Tehrani et al. |
| 5,702,831 A | 12/1997 | Chen et al. |
| 5,712,612 A | 1/1998 | Lee et al. |
| 5,715,121 A | 2/1998 | Sakakima et al. |
| 5,729,410 A | 3/1998 | Fontana, Jr. et al. |
| 5,732,016 A | 3/1998 | Chen et al. |
| 5,734,605 A | 3/1998 | Zhu et al. |
| 5,745,408 A | 4/1998 | Chen et al. |
| 5,748,519 A | 5/1998 | Tehrani et al. |
| 5,757,056 A | 5/1998 | Chui |
| 5,761,110 A | 6/1998 | Irrinki et al. |
| 5,764,567 A | 6/1998 | Parkin |
| 5,766,743 A | 6/1998 | Fujikata et al. |
| 5,768,181 A | 6/1998 | Zhu et al. |
| 5,774,394 A | 6/1998 | Chen et al. |
| 5,774,404 A | 6/1998 | Eto |
| 5,786,275 A | 7/1998 | Kubo |
| 5,801,984 A | 9/1998 | Parkin |
| 5,804,250 A | 9/1998 | Yang |
| 5,804,485 A | 9/1998 | Liang |
| 5,825,685 A | 10/1998 | Yamane et al. |
| 5,828,578 A | 10/1998 | Blomgren |
| 5,831,920 A | 11/1998 | Chen et al. |
| 5,832,534 A | 11/1998 | Sing et al. |
| 5,835,314 A | 11/1998 | Moodera et al. |
| 5,838,608 A | 11/1998 | Zhu et al. |
| 5,852,574 A | 12/1998 | Naji |
| 5,856,008 A | 1/1999 | Cheong et al. |
| 5,861,328 A | 1/1999 | Tehrani et al. |
| 5,892,708 A | 4/1999 | Pohm |
| 5,894,447 A | 4/1999 | Takashima |
| 5,898,612 A | 4/1999 | Chen et al. |
| 5,902,690 A | 5/1999 | Tracy et al. |
| 5,905,996 A | 5/1999 | Pawlowski |
| 5,907,784 A | 5/1999 | Larson |
| 5,917,749 A | 6/1999 | Chen et al. |
| 5,920,500 A | 7/1999 | Tehrani et al. |
| 5,926,414 A | 7/1999 | McDowell et al. |
| 5,930,164 A | 7/1999 | Zhu |
| 5,932,343 A | 8/1999 | Hayashi et al. |
| 5,940,319 A | 8/1999 | Durlam et al. |
| 5,943,284 A | 8/1999 | Mizuno et al. |
| 5,943,574 A | 8/1999 | Tehrani et al. |
| 5,946,227 A | 8/1999 | Naji |
| 5,946,228 A | 8/1999 | Abraham et al. |
| 5,948,553 A | 9/1999 | Kamijo |
| 5,949,622 A | 9/1999 | Kamiguchi et al. |
| 5,949,696 A | 9/1999 | Threewitt |
| 5,953,248 A | 9/1999 | Chen et al. |
| 5,955,211 A | 9/1999 | Maeda et al. |
| 5,956,267 A | 9/1999 | Hurst et al. |
| 5,959,880 A | 9/1999 | Shi et al. |
| 5,966,012 A | 10/1999 | Parkin |
| 5,966,323 A | 10/1999 | Chen et al. |
| 5,976,713 A | 11/1999 | Fuke et al. |
| 5,978,257 A | 11/1999 | Zhu et al. |
| 5,982,660 A | 11/1999 | Bhattacharyya |
| 5,985,356 A | 11/1999 | Schultz et al. |
| 5,985,365 A | 11/1999 | Jaye |
| 5,986,858 A | 11/1999 | Sato et al. |
| 5,986,925 A | 11/1999 | Naji et al. |
| 5,990,011 A | 11/1999 | McTeer |
| 5,998,040 A | 12/1999 | Nakatani et al. |
| 6,004,654 A | 12/1999 | Shinjo et al. |
| 6,005,753 A | 12/1999 | Fontana, Jr. et al. |
| 6,016,269 A | 1/2000 | Peterson et al. |
| 6,023,395 A | 2/2000 | Dill et al. |
| 6,048,739 A | 4/2000 | Hurst et al. |
| 6,052,302 A | 4/2000 | Moyer et al. |
| 6,052,303 A | 4/2000 | Chevallier et al. |
| 6,054,226 A | 4/2000 | Takeda et al. |
| 6,055,178 A | 4/2000 | Naji |
| 6,055,179 A | 4/2000 | Koganei et al. |
| 6,069,820 A | 5/2000 | Inomata et al. |
| 6,072,718 A | 6/2000 | Abraham et al. |
| 6,083,764 A | 7/2000 | Chen |
| 6,097,625 A | 8/2000 | Scheuerlein |
| 6,097,626 A | 8/2000 | Brug et al. |
| 6,111,784 A | 8/2000 | Nishimura |
| 6,114,719 A | 9/2000 | Dill et al. |
| 6,120,842 A | 9/2000 | Lu et al. |
| 6,127,045 A | 10/2000 | Gill |
| 6,134,060 A | 10/2000 | Ryat |
| 6,134,139 A | 10/2000 | Bhattacharyya et al. |
| 6,145,055 A | 11/2000 | Fujimoto |
| 6,163,477 A | 12/2000 | Tran |
| 6,165,803 A | 12/2000 | Chen et al. |
| 6,166,948 A * | 12/2000 | Parkin et al. ............... 365/173 |
| 6,169,687 B1 | 1/2001 | Johnson |
| 6,169,689 B1 | 1/2001 | Naji |
| 6,172,903 B1 | 1/2001 | Nishimura |
| 6,175,475 B1 | 1/2001 | Lin et al. |
| 6,175,515 B1 | 1/2001 | Peczalski et al. |
| 6,178,074 B1 | 1/2001 | Gill |
| 6,178,112 B1 | 1/2001 | Bessho et al. |
| 6,180,444 B1 | 1/2001 | Gates et al. |
| 6,185,143 B1 | 2/2001 | Perner et al. |
| 6,188,549 B1 | 2/2001 | Wiitala |
| 6,189,077 B1 | 2/2001 | Robertson et al. |
| 6,191,972 B1 | 2/2001 | Miura et al. |
| 6,195,240 B1 | 2/2001 | Gill |
| 6,198,610 B1 | 3/2001 | Kawawake et al. |
| 6,205,051 B1 | 3/2001 | Brug et al. |

| | | | | | | |
|---|---|---|---|---|---|---|
| 6,205,052 B1 * | 3/2001 | Slaughter et al. ........... 365/173 | 2001/0050859 A1 | 12/2001 | Siegfried | |
| 6,205,073 B1 | 3/2001 | Naji | 2002/0024780 A1 | 2/2002 | Mao et al. | |
| 6,211,090 B1 | 4/2001 | Durlam et al. | 2002/0036331 A1 | 3/2002 | Nickel et al. | |
| 6,232,777 B1 | 5/2001 | Sato et al. | 2002/0036919 A1 | 3/2002 | Daughton et al. | |
| 6,233,172 B1 | 5/2001 | Chen et al. | 2002/0039308 A1 | 4/2002 | Gogl et al. | |
| 6,249,406 B1 | 6/2001 | Gill et al. | 2002/0044396 A1 | 4/2002 | Amano et al. | |
| 6,256,247 B1 | 7/2001 | Perner | 2002/0048185 A1 | 4/2002 | Thewes et al. | |
| 6,259,586 B1 | 7/2001 | Gill | 2002/0058158 A1 | 5/2002 | Odagawa et al. | |
| 6,269,018 B1 | 7/2001 | Monsma et al. | 2002/0080644 A1 | 6/2002 | Ito | |
| 6,269,040 B1 | 7/2001 | Reohr et al. | 2002/0080664 A1 | 6/2002 | Gogl et al. | |
| 6,272,040 B1 | 8/2001 | Salter et al. | 2002/0089024 A1 | 7/2002 | Iwata | |
| 6,275,363 B1 | 8/2001 | Gill | 2002/0097540 A1 | 7/2002 | Hayashi et al. | |
| 6,277,762 B1 | 8/2001 | Hwang | 2002/0097602 A1 | 7/2002 | Lammers | |
| 6,278,631 B1 | 8/2001 | Naji | 2002/0154539 A1 | 10/2002 | Swanson et al. | |
| 6,281,538 B1 | 8/2001 | Slaughter | 2002/0159203 A1 | 10/2002 | Saito et al. | |
| 6,285,581 B1 | 9/2001 | Tehrani | 2003/0042562 A1 | 3/2003 | Giebler et al. | |
| 6,292,336 B1 | 9/2001 | Horng et al. | 2003/0072174 A1 | 4/2003 | Savichenko et al. | |
| 6,292,389 B1 | 9/2001 | Chen et al. | 2003/0089933 A1 | 5/2003 | Janesky et al. | |
| 6,295,225 B1 | 9/2001 | Oepts | | | | |
| 6,313,973 B1 | 11/2001 | Fuke et al. | FOREIGN PATENT DOCUMENTS | | | |
| 6,314,020 B1 | 11/2001 | Hansen et al. | DE | 196 30 343 | 7/1998 | |
| 6,317,299 B1 | 11/2001 | Pinarbasi | EP | 0 068 760 | 10/1985 | |
| 6,317,376 B1 | 11/2001 | Tran et al. | EP | 0 279 537 | 12/1993 | |
| 6,322,640 B1 | 11/2001 | Xiao et al. | EP | 0 613 148 | 1/1994 | |
| 6,330,137 B1 | 12/2001 | Knapp et al. | EP | 0 335 715 | 7/1995 | |
| 6,331,943 B1 | 12/2001 | Naji et al. | EP | 0 773 551 | 5/1997 | |
| 6,331,944 B1 | 12/2001 | Monsma et al. | EP | 0 936 624 | 8/1999 | |
| 6,338,899 B1 | 1/2002 | Fukuzawa et al. | EP | 0 962 939 | 8/1999 | |
| 6,341,053 B1 | 1/2002 | Nakada et al. | EP | 0 971 424 | 1/2000 | |
| 6,341,084 B2 | 1/2002 | Numata et al. | EP | 0 992 984 | 4/2000 | |
| 6,343,032 B1 | 1/2002 | Black et al. | EP | 1 061 592 | 12/2000 | |
| 6,344,954 B1 | 2/2002 | Redon et al. | EP | 1 168 355 | 1/2001 | |
| 6,351,408 B1 | 2/2002 | Schwarzl et al. | EP | 0 768 672 | 4/2001 | |
| 6,351,409 B1 | 2/2002 | Rizzo et al. | EP | 1 094 467 | 4/2001 | |
| 6,358,756 B1 | 3/2002 | Sandhu et al. | EP | 1 109 068 | 6/2001 | |
| 6,359,805 B1 | 3/2002 | Hidaka | EP | 1 109 170 | 6/2001 | |
| 6,363,007 B1 | 3/2002 | Lu et al. | EP | 0 624 868 | 8/2001 | |
| 6,366,494 B2 | 4/2002 | Weber et al. | EP | 1 126 531 | 8/2001 | |
| 6,379,978 B2 | 4/2002 | Goebel et al. | EP | 1 298 669 | 4/2003 | |
| 6,383,574 B1 | 5/2002 | Han et al. | EP | 0 929 110 | 12/2003 | |
| 6,385,109 B1 | 5/2002 | Naji | GB | 1 052 646 | 3/1985 | |
| 6,388,917 B2 | 5/2002 | Hoffmann | JP | 01 214077 | 2/1988 | |
| 6,389,524 B1 | 5/2002 | Sato | JP | 02 288209 | 4/1989 | |
| 6,392,922 B1 | 5/2002 | Liu et al. | JP | 06 061293 | 3/1994 | |
| 6,392,923 B1 | 5/2002 | Naji | JP | 09 050611 | 12/1995 | |
| 6,392,924 B1 | 5/2002 | Liu et al. | JP | 09 199769 | 1/1996 | |
| 6,396,735 B2 | 5/2002 | Michijima et al. | JP | 08 096328 | 4/1996 | |
| 6,404,674 B1 | 6/2002 | Anthony et al. | JP | 08 321739 | 12/1996 | |
| 6,418,046 B1 | 7/2002 | Naji | JP | 09 306159 | 11/1997 | |
| 6,424,562 B1 | 7/2002 | Rosner et al. | JP | 09 306733 | 11/1997 | |
| 6,429,497 B1 | 8/2002 | Nickel | JP | 09 325746 | 12/1997 | |
| 6,430,084 B1 | 8/2002 | Rizzo et al. | JP | 10 004226 | 1/1998 | |
| 6,436,526 B1 | 8/2002 | Odagawa et al. | JP | 10 162326 | 6/1998 | |
| 6,445,612 B1 | 9/2002 | Naji | JP | 10 162568 | 6/1998 | |
| 6,449,133 B1 | 9/2002 | Makino et al. | JP | 10 270776 | 10/1998 | |
| 6,469,878 B1 | 10/2002 | Mack et al. | JP | 11 039858 | 2/1999 | |
| 6,473,335 B2 | 10/2002 | Bohm et al. | JP | 11 316913 | 11/1999 | |
| 6,475,812 B2 | 11/2002 | Nickel et al. | JP | 2000 090418 | 3/2000 | |
| 6,487,110 B2 | 11/2002 | Nishimura et al. | JP | 2000 123325 | 4/2000 | |
| 6,493,259 B1 | 12/2002 | Swanson et al. | JP | 2000 132961 | 5/2000 | |
| 6,501,144 B1 | 12/2002 | Rizzo | JP | 2000 286478 | 10/2000 | |
| 6,515,895 B2 | 2/2003 | Naji | JP | 2001 068760 | 3/2001 | |
| 6,531,723 B1 | 3/2003 | Engel et al. | JP | 2001 084756 | 3/2001 | |
| 6,538,919 B1 | 3/2003 | Abraham et al. | JP | 2002 141481 | 5/2002 | |
| 6,545,906 B1 * | 4/2003 | Savtchenko et al. ......... 365/158 | JP | 2002 170374 | 6/2002 | |
| 6,556,473 B2 | 4/2003 | Saito et al. | JP | 2002 334585 | 11/2002 | |
| 6,567,246 B1 * | 5/2003 | Sakakima et al. ..... 360/324.11 | WO | WO 93/09541 | 5/1993 | |
| 6,600,184 B1 * | 7/2003 | Gill ........................... 257/295 | WO | WO 96/41379 | 12/1996 | |
| 6,611,453 B2 * | 8/2003 | Ning ........................... 365/171 | WO | WO 99/18578 | 9/1998 | |
| 6,633,498 B1 | 10/2003 | Engel et al. | WO | WO 98/47613 | 10/1998 | |
| 6,674,662 B1 | 1/2004 | Hillebrands et al. | WO | WO 00/04551 | 1/2000 | |
| 2001/0026470 A1 | 10/2001 | Gillies et al. | WO | WO 00/058970 | 10/2000 | |
| 2001/0035545 A1 | 11/2001 | Schuster-Woldan et al. | | | | |

| WO | WO 02/41367 | 5/2002 |
| WO | WO 02/073620 | 9/2002 |

OTHER PUBLICATIONS

Pohm et al., "The Architecture of a High Performance Mass Store with GMR Memory Cells," IEEE Transactions on Magnetics, Bd. 31, Nr. 6, Nov. 1995, 3200-3202.

Pohm et al., "Demagnetization Effects on Forward and Reverse Thresholds of M-R Memory Elements," Journal of Applied Physics, Bd. 69, Nr. 8, 5763-5764.

Pohm et al., The Energy and Width of Paired Neel Walls in Double Layer M-R Films, IEEE Transactions on Magnetics, Bd. 26, Nr. 5, Sep. 1990, 2831-2833.

Pohm et al., "Experimental and Analytical Properties of 0.2 Micron Wide, Multi-Layer, GMR, Memory Elements," IEEE Transactions on Magnetics, Bd. 32, Nr. 5, Sep. 1996, 4645-1647.

Pohm et. al., "Future Projections and Capabilities of GMR NV Memory," IEEE International Nonvolatile Memory Technology Conference, 24-26, Jun. 1996, 113-115.

Tehrani et al., "High Density Nonvolatile Magnetoresistive RAM," International Electron Devices Meeting, Dec. 1996, 193-196.

Comstock et al., "Perturbations to the Stoner-Wohlfarth Threshold in 2×20 um M-R Memory Elements," Journal of Applied Physics, Bd. 63, Nr. 8, Apr. 15, 1988, 4321-4323.

Beech et al., "Simulation of Sub-Micron GMR Memory Cells," IEEE Transactions on Magnetics, Bd. 31, Nr. 6, Nov. 1995, 3200-3202.

Tang et al., "Spin-Valve RAM Cell," IEEE Transactions on Magnetics, Bd. 31, Nr. 6, Nov. 1995, 3206-3208.

Yoo et al., "2-Dimensional Numerical Analysis of Laminated Thin Film Elements," IEEE Transactions on Magnetics, Bd. 24, Nr. 6, Nov. 1988, 2377-2379.

Uhm et al., "Computer Simulation of Switching Characteristics in Magnetic Tunnel Junctions Exchange-Biased by Synthetic Antiferromagnets," Journal of Magnetism and Magnetic Materials, vol. 239, Issues 1-3, Feb. 2002, pp. 123-125.

* cited by examiner

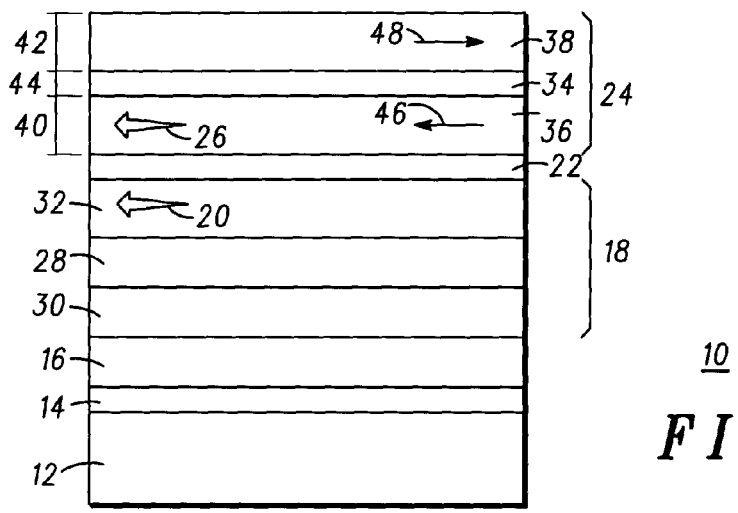
FIG. 1
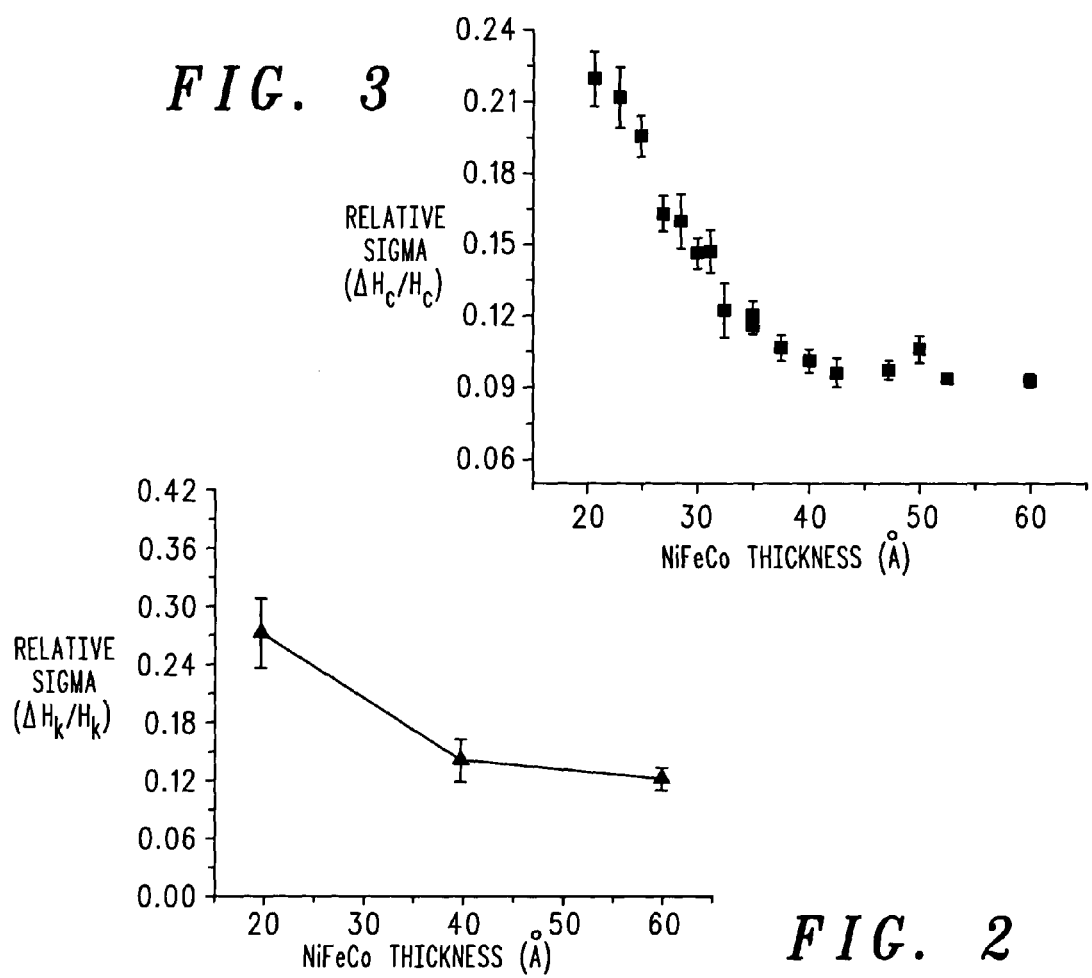
FIG. 3
FIG. 2

MAGNETORESISTIVE RANDOM ACCESS MEMORY WITH REDUCED SWITCHING FIELD VARIATION

FIELD OF THE INVENTION

This invention relates to semiconductor memory devices and, more particularly, to the switching characteristics of an array of multi-layer magnetic memory cells.

BACKGROUND OF THE INVENTION

In the past, a variety of magnetic materials and structures have been utilized to form magnetoresistive materials for non-volatile memory elements, read/write heads for disk drives, and other magnetic type applications. Resistance changes due to relative changes in the magnetic states of constituent magnetic regions within these structures allow information to be stored, in the case of memories, or read, in the case of read heads. Memories made of magnetoresistive material, such as Magnetic Random Access Memory (hereinafter referred to as MRAM) has the potential to overcome some of the shortcomings associated within memories currently in production today. Dynamic Random Access Memory (DRAM), Static Random Access Memory (SRAM), and Flash are the three dominant types of memories currently in use. Each of these memory devices uses an electronic charge to store information and each has its own advantages and disadvantages. SRAM has fast read and write speeds, but it is volatile and requires large cell area. DRAM has high density, but it is also volatile and requires a refresh of the storage capacitor every few milliseconds. This requirement increases the complexity of the control electronics. FLASH is the major nonvolatile memory device in use today. FLASH uses charge trapped in a floating oxide layer to store information. Drawbacks to FLASH include high voltage requirements and slow program and erase times. Also, FLASH memory has a poor write endurance of $10^4$–$10^6$ cycles before memory failure. In addition, to maintain reasonable data retention, the thickness of the gate oxide has to stay above the threshold that allows electron tunneling, thus restricting FLASH's scaling trends. MRAM has the potential to have the speed performance similar to DRAM without the need for refresh, have improved density performance over SRAM without the volatility, and have improved endurance and write performance over FLASH.

As mentioned above magnetoresistive devices and MRAM in particular rely on resistance changes resulting from changes in the magnetization directions of constituent magnetic layers in the material stack. Typically, MRAM devices comprise a magnetic layer whose magnetization direction is fixed, the fixed layer, and a magnetic layer, the free layer, whose magnetization direction is free to switch between two or more stable directions separated by a spacer layer of an oxide (Tunneling magnetoresistance) or conductor (Giant magnetoresistance). Typical MRAM architectures involve laying out the individual magnetoresistive elements at the intersection of a crosspoint of mutually perpendicular current lines. These lines need not be in contact with the element. Their purpose is mainly to provide the magnetic fields, by having current passed along their length, to switch the magnetization direction of the free layer, within the element. In the absence of these fields, the magnetization direction of the free layer is stable. This is the procedure by which information is written to the memory. Reading information is typically accomplished by passing a small current through the element and comparing the resistance to a reference resistance.

For the successful operation of an MRAM device, it is required that the magnetic behavior of the free layers of an array of elements be very uniform. This is related to the crosspoint architecture mentioned above. The current lines each provide enough current to produce approximately half of the magnetic field required for the free layer to alter its state, i.e. half the switching field. Magnetic state is defined here as a stable direction of the magnetization of the free layer. The two half fields combine at the point of intersection of the current lines to provide enough field there so that the elements' free layer magnetic state will change. All other bits in the array are exposed to at most approximately half the switching field. The uniformity in the magnetic behavior or the switching field for the array of bits is essential so that the half fields produced do not inadvertently cause an unwanted bit to switch its state and, in addition, that the two half fields combine to switch all the bits in the array.

It would be highly advantageous and is the intention of the current application, therefore, to provide means of decreasing the variation in the switching field bit to bit.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the following drawings:

FIG. 1 is an enlarged, simplified side view of a multi-layer magnetic memory cell, in accordance with the preferred embodiment of the present invention;

FIG. 2 attached is a graph of the relative variation of a magnetic intrinsic anisotropy verses a thickness of a single bulk nickel iron cobalt (NiFeCo) layer;

FIG. 3 illustrates the relative variation of the switching field of patterned bits verses a thickness of a single patterned nickel iron cobalt (NiFeCo) layer;

DETAILED DESCRIPTION OF THE PREFERRED EMBODIMENT

Figure 4:
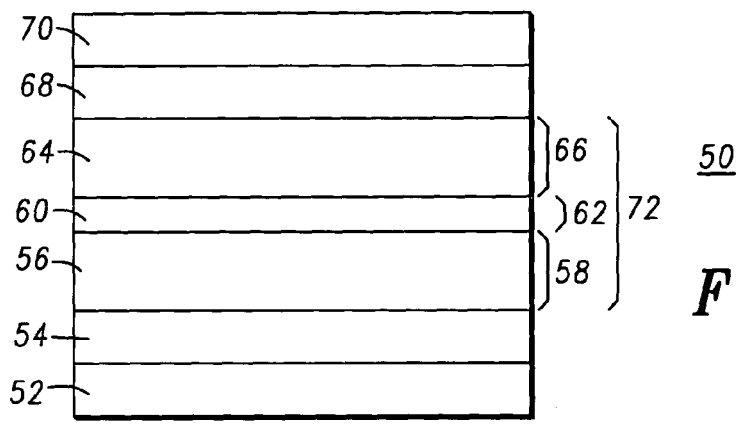
FIG. 4 is a simplified view of a magnetic memory cell used to experimentally measure a magnetic anisotropy and a relative magnetic anisotropy variation of a magnetic layer.

Turn now to FIG. 1, which illustrates a simplified sectional view of a scalable magnetoresistive tunneling junction memory cell 10 in accordance with the present invention. The scalable magnetoresistive tunneling junction memory cell 10 includes a supporting substrate 12 onto which a seed layer 14 is positioned. Supporting substrate 12 may be, for example, a semiconductor substrate or wafer and semiconductor control devices may then be formed thereon. Seed layer 14 is formed on supporting substrate 12 to aid in the formation and operation of the remaining layers of material. An anti-ferromagnetic layer 16 is then positioned on seed layer 14 and includes, for example, alloys of manganese (Mn) and one of Ni, Fe, Pt, Rh or combinations thereof. It will be understood that seed layer 14 is optional and is included in this preferred embodiment for illustrative purposes. Also, the positioning of anti-ferromagnetic layer 16 is for fabrication convenience with many other possible configurations available.

A first magnetic region 18 having a resultant magnetic moment vector 20 is positioned on the anti-ferromagnetic layer 16. A nonmagnetic separating layer 22 is placed on first magnetic region 18 and a second magnetic region 24 having a resultant magnetic moment vector 26 is positioned on nonmagnetic separating layer 22. Nonmagnetic separating layer 22 can be a dielectric material which behaves as a tunneling barrier to produce a magnetic tunnel junction that exhibits tunneling magnetoresistance or it may be a conductive material such as copper to produce a layered metallic structure which exhibits giant magnetoresistance. It will be understood that nonmagnetic separating layer 22 can include multiple insulating layers, but is shown as one layer for illustrative purposes.

Anti-ferromagnetic layer 16 pins resultant magnetic moment vector 20 unidirectionally along a preferred magnetic axis unless sufficient magnetic field is supplied to overcome the pinning action of layer 16. Generally, anti-ferromagnetic layer 16 is thick enough to insure that spurious signals and normal cell writing signals will not switch resultant magnetic moment vector 20.

In the preferred embodiment, fixed magnetic region 18 includes a synthetic anti-ferromagnetic layer material which includes a tri-layer structure of an anti-ferromagnetic coupling spacer layer 28 sandwiched between a ferromagnetic layer 30 and a ferromagnetic layer 32. However, it will be understood that magnetic region 18 can include a synthetic anti-ferromagnetic layer material other than a tri-layer structure and the use of a tri-layer structure in this embodiment is for illustrative purposes only. Further, magnetic region 18 is a fixed ferromagnetic region, meaning that the magnetic moment vectors of layers 30 and 32 are not free to rotate in the presence of a moderate applied magnetic field and layer 32 is used as the reference layer.

A free magnetic region 24 includes a synthetic anti-ferromagnetic layer material which includes N ferromagnetic layers that are anti-ferromagnetically coupled, wherein N is a integer number greater than or equal to two. In the embodiment shown here for simplicity, N is chosen to be equal to two so that magnetic region includes a tri-layer structure which has an anti-ferromagnetic coupling spacer layer 34 sandwiched between a ferromagnetic layer 36 and a ferromagnetic layer 38. Ferromagnetic layers 36 and 38 each have thicknesses 40 and 42, respectively. Further, anti-ferromagnetic coupling spacer layer 34 has a thickness 44. It will be understood that the synthetic anti-ferromagnetic layered material in magnetic region 24 can include other structures with a different number of ferromagnetic layers and the use of a tri-layer structure in this embodiment is for illustrative purposes only. For example, a five-layer stack of a ferromagnetic layer/anti-ferromagnetic coupling spacer layer/ferromagnetic layer/anti-ferromagnetic coupling spacer layer/ferromagnetic layer could be used, wherein N is equal to three.

Anti-ferromagnetic coupling spacer layers 28 and 34 most often include elements Ru, Os, Re, Cr, Rh, and Cu, or combinations thereof. Further, ferromagnetic layers 30, 32, 36, and 38 most often include alloys of Ni, Fe, Co, or combinations thereof. Ferromagnetic layers 36 and 38 each have a magnetic moment vector 46 and 48, respectively, that are usually held anti-parallel by coupling of anti-ferromagnetic coupling spacer layer 34. Also, magnetic region 24 has a resultant magnetic moment vector 26. When no magnetic field is applied, resultant magnetic moment vectors 20 and 26 are oriented along a preferred anisotropy easy-axis. Further, magnetic region 24 is a free ferromagnetic region, meaning that resultant magnetic moment vector 26 is free to rotate in the presence of an applied magnetic field.

While anti-ferromagnetic coupling layers are illustrated between the ferromagnetic layers in magnetic regions 18 and 24, it will be understood that the ferromagnetic layers could be anti-ferromagnetically coupled through other means such as magnetostatic fields or other features. For example, for structures with a high aspect ratio, the ferromagnetic layers are anti-parallel coupled from magnetostatic flux closure. In this case, any nonmagnetic spacer layer that breaks the ferromagnetic exchange between layers will suffice. However, in the preferred embodiment, the adjacent ferromagnetic layers are anti-ferromagnetically coupled by sandwiching anti-ferromagnetic coupling material between each adjacent ferromagnetic layer. One advantage of using a synthetic anti-ferromagnetic layer material is that the anti-parallel coupling of the magnetic moment vectors prevents a vortex from forming at a given thickness where a vortex would be formed if using a single layer.

Further, during fabrication of scalable magnetoresistive tunneling junction memory cell 10, each succeeding layer (i.e. 14, 16, 30, etc.) is deposited or otherwise formed in sequence and each cell may be defined by selective deposition, photolithography processing, etching, etc. in any of the techniques known in the semiconductor industry. During deposition of at least the ferromagnetic layers 36 and 38, a magnetic field is provided to set an easy magnetic axis for these layers (induced anisotropy). This anisotropy axis can also be set subsequent to deposition by annealing in the presence of a magnetic field.

The structure of magnetic region 24 substantially impacts the variation in the switching for an array of MRAM devices. In the preferred embodiment to minimize the variation in the switching field $H_{sw}$, the magnetic layer (i.e. layer 36) in magnetic region 24 adjacent to nonmagnetic spacer region 22 is formed to have a thickness greater than layer 38 and in the range of 40 Å to 120 Å. A thicker layer 36 has been found to significantly improve the magnetic properties of layer 36 so that $H_{sw}$ is approximately equal from one MRAM device to another. In general, it has been found that the switching variation of the elements within the array is impacted by the quality of the magnetic material initially deposited on the nonmagnetic separating layer 22. Therefore, the essence of this patent is to optimize the material quality of layer 36, and retain acceptable switching characteristics by making layer 36 part of a SAF structure. As mentioned above SAP structures provide a reduction in the formation of magnetization vortices (where the magnetization direction is not uniaxial but circular) and a way to control the switching field See U.S. Pat. No. 6,531,723.

A significant degradation in the magnetic quality of magnetic layer 36 is seen starting at thicknesses below approximately 50 Å to 60 Å (See FIG. 2). This can be seen by an increase in the relative variation of the intrinsic material anisotropy normalized to the mean anisotropy. Intrinsic material anisotropy is an energy defining the preferred stable uniaxial magnetization direction. The magnitude of the switching field $H_{sw}$ for an unbalanced free magnetic region is controlled in part by the intrinsic anisotropy (See U.S. Pat. No. 6,531,723), and a larger variation in the intrinsic anisotropy will directly result from the increase in the variation of the magnetic switching field $H_{sw}$ for patterned MRAM devices. Illustrated in FIG. 2 is the relative variation of the intrinsic material anisotropy measured for various thicknesses 40 within a range approximately from 20 Å to 60 Å for magnetic layer 36 deposited in a magnetic field on an aluminum oxide layer 22 and annealed in a magnetic field at 250° C. for 30 minutes. As shown, the relative variation of the intrinsic anisotropy decreases for thicker magnetic layers which illustrates that magnetic memory cells grown with thicker magnetic layers positioned adjacent to the nonmagnetic spacer region will show improved magnetic properties.

Turn now to FIG. 3 which illustrates a graph of the relative variation of a magnetic switching field $H_{sw}$, for an array of patterned magnetic elements having a single free magnetic layer (i.e. thickness 44 equals zero and thickness 42 equals zero) verses thickness of the layer, the layer being composed of nickel iron cobalt (NiFeCo) grown on an aluminum oxide nonmagnetic spacer layer 22. The size and shape of the elements are aspect ratio 2 ellipse shape with a width of 0.45 micrometers. As can be seen in FIG. 3, there is a minimum in the relative variation of the switching fields within the array beginning at approximately 40 Å. Greater than 40 Å, the relative variation is constant with thickness because it is dominated by variations in shape anisotropy from bit-to-bit that scale with the increasing moment. Below 40 Å there is an increase in the relative variation with decreasing thickness. This behavior is due to the degradation in material quality shown in FIG. 2. The poor magnetic properties of the thin magnetic layer directly increases the magnetic switching field variation from one MRAM device to another in the array of MRAM devices. The preferred embodiment addresses these shortcomings by making layer 36 thicker with better material quality while effectively making the whole stack thinner by anti-ferromagnetically coupling layer 38 to 36. The preferred embodiment has the material quality of a thick layer but the shape contribution and lack of vortex formation of a thin layer.

Turn now to FIG. 4 which illustrates a magnetic memory cell 50 used to experimentally measure a magnetic anisotropy and a relative magnetic anisotropy variation of SAF layers 72. In a preferred embodiment, cell 50 includes a conductive layer 52. An insulator layer 54 is positioned on conductive layer 52 and a magnetic layer 56 with a thickness 58 is positioned on insulator layer 54. An anti-ferromagnetic spacer layer 60 with a thickness 62 is positioned on magnetic layer 56 and a magnetic layer 64 with a thickness 66 is positioned on spacer layer 60. Further, an insulator layer 68 is positioned on magnetic layer 64 and a conductive layer 70 is positioned on insulator layer 68.

In this specific example, conductive layers 52 and 70 include tantalum (Ta) and insulator layers 54 and 68 include aluminum oxide (AlO). Further, in this specific example, magnetic layers 56 and 64 include nickel iron (NiFe) and spacer layer 60 includes ruthenium (Ru) wherein magnetic layers 56 and 64 are anti-ferromagnetically coupled. It will be understood that the materials included in layers 52, 54, 56, 60, 64, 68, and 70 of this specific example are chosen for simplicity and ease of discussion to illustrate a measurement result and that other materials could be chosen.

In the preferred embodiment, magnetic layers 56 and 64 are anti-ferromagnetically coupled by spacer layer 60. However, it will be understood that magnetic layers 56 and 64 can be magnetically coupled through other means. Further, cell 50 is illustrated as including two magnetic layers (i.e. layers 56 and 64) for simplicity and ease of discussion to show the experimental measurement.

Figure 5:
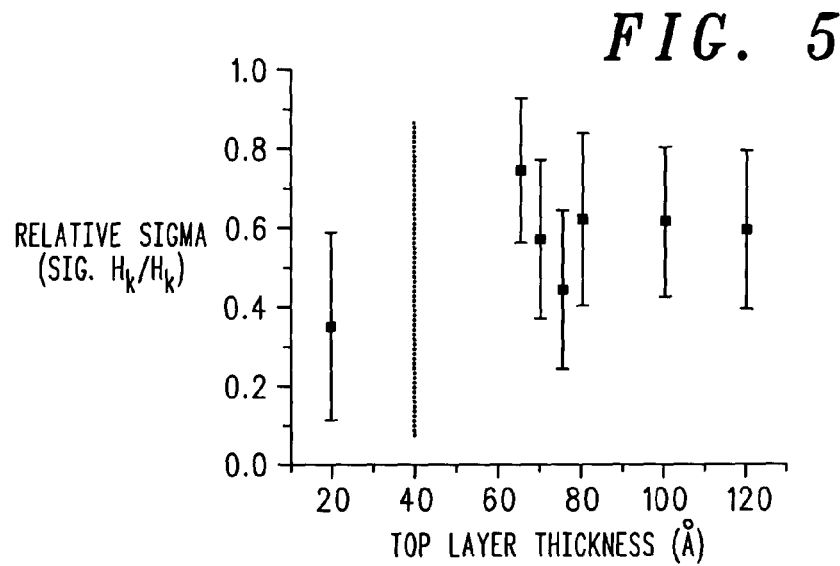
FIG. 5 is a graph of a relative magnetic anisotropy variation of the magnetic intrinsic anisotropy illustrated in FIG. 4 versus thickness of a magnetic layer.

Turn now to FIG. 5 which illustrates a graph of a relative magnetic anisotropy variation of the SAF structure 72 verses thickness 66 as illustrated in FIG. 4. In this illustration, thickness 66 is varied from approximately 20 Å to 120 Å wherein thickness 58 is approximately 40 Å. As shown, the relative magnetic anisotropy variation is approximately constant as a function of thickness 66. This result indicates that the variation depends substantially on thickness 58 (See FIG. 2) adjacent to tunneling barrier junction 54 and is independent of subsequent layers magnetic grown thereon (i.e. layer 64).

Figure 6:
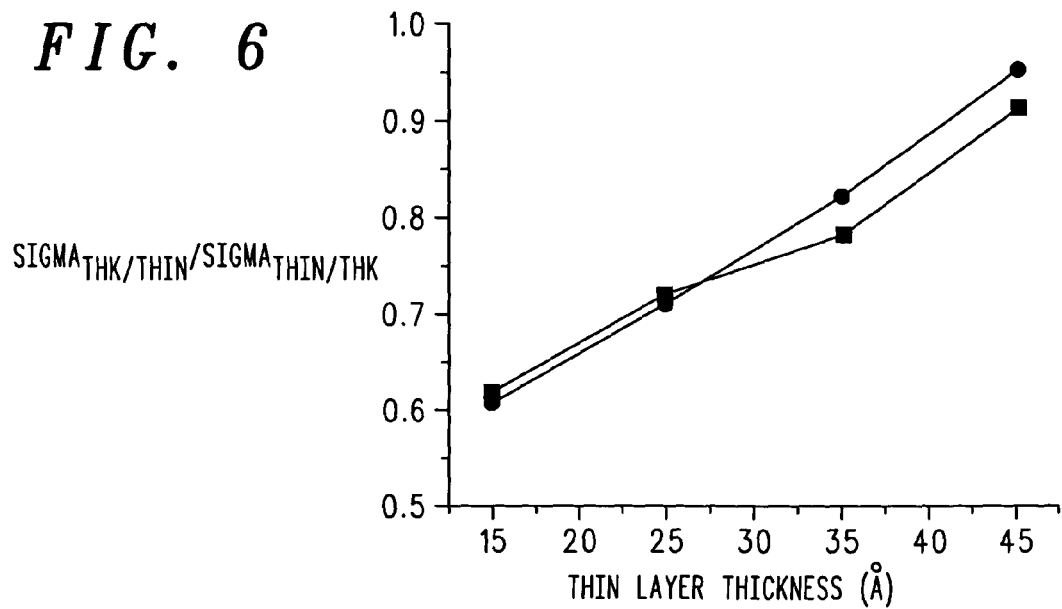
FIG. 6 is a graph of a relative switching variation of the magnetic memory cell illustrated in FIG. 1 for aspect ratios of two and three versus different combinations of material stack.

Turn now to FIG. 6 which illustrates the measured improvement of the switching distribution width (sigma) of patterned bits by depositing the thick layers of an unbalanced SAF first on the tunnel barrier 22. Shown in FIG. 6 is a ratio of a variation for a thin magnetic layer 38 grown on a thick magnetic layer 36 divided by a variation of a thick magnetic layer 38 grown on a thin magnetic layer 36 as a function of the thin layer thickness for an array of aspect ratio 2 and 3 ellipse shaped bits of width 0.45 micrometers. For example, as thinner layer in 24 increases from 15 Å to 45 Å, the ratio of the sigmas from depositing the thick layer first on the tunnel barrier 22 to depositing the thin layer first on 22 increases from approximately 0.6 at 15 Å to 0.95 at 45 Å. The variation within an array can be reduced by as much as 40% by depositing the layer with good material quality on the tunnel barrier 22. This result indicates that for thicknesses below approximately 50 Å the variation in the switching field for an array of elements is reduced when the thicker layer is deposited on the tunnel barrier 22. Various changes and modifications to the embodiments herein chosen for purposes of illustration will readily occur to those skilled in the art. For example, thickness is one method for improving the material quality. In addition improved material quality can be obtained from deposition of an amorphous alloy, such as CoFeB alloys, on top of the tunnel barrier. Also material quality can be improved through high temperature anneals and depositions. To the extent that such modifications and variations do not depart from the spirit of the invention, they are intended to be included within the scope thereof which is assessed only by a fair interpretation of the following claims.

What is claimed is:

1. A multi-state, multi-layer magnetic memory device, comprising:
    a nonmagnetic spacer region with a surface; and
    a free magnetic region positioned adjacent to the surface of the nonmagnetic spacer region, the free magnetic region including:
    a first magnetic layers having a first thickness; and
    a second magnetic layer positioned adjacent to the nonmagnetic spacer region, the second magnetic layer having a second thickness that is greater than about 40 Å and also greater than the first thickness.

2. A device as claimed in claim 1 wherein the second magnetic layer is an amorphous magnetic alloy.

3. A device as claimed in claim 1 wherein the free magnetic region includes an anti-ferromagnetic coupling spacer layer.

4. A device as claimed in claim 3 wherein the anti-ferromagnetic coupling spacer material includes at least one of copper (Cu), silver (Ag), gold (Au), chromium (Cr), ruthenium (Ru), rhenium (Re), osmium (Os), titanium (Ti), Rhodium (Rh), platinum (Pt), palladium (Pd), and alloys thereof.

5. A device as claimed in claim 1 wherein the free magnetic region includes at least one of nickel (Ni), iron (Fe), cobalt (Co), manganese (Mn), combinations thereof, and alloys thereof.

6. A device as claimed in claim 1 wherein the free magnetic region includes a synthetic anti-ferromagnetic material region including N ferromagnetic layers which are anti-ferromagnetically coupled where N is a whole number greater than or equal to two.

7. A device as claimed in claim 6 wherein each of the N ferromagnetic layers is anti-ferromagnetically coupled by sandwiching a layer of an anti-ferromagnetic coupling material between each adjacent ferromagnetic layer in the N ferromagnetic layers.

8. A device as claimed in claim 1 wherein a fixed magnetic region is positioned adjacent to a second surface of the nonmagnetic spacer region.

9. A device as claimed in claim 1 wherein the nonmagnetic spacer region includes at least one of aluminum oxide (AlC), aluminum nitride (AlN), silicon oxide (SiO).

10. A device as claimed in claim 1 wherein the nonmagnetic spacer is a conductive material including at least one of copper (Cu), chromium (Cr), silver (Ag), and gold (Au).

11. A device as claimed in claim 6 wherein one of the N ferromagnetic layers of the synthetic anti-ferromagnetic material region that is positioned adjacent to the surface of the nonmagnetic spacer is at least as thick as any of the other N ferromagnetic layers which comprise the synthetic anti-ferromagnetic material region.

12. A device as claimed in claim 1 wherein the second thickness is less than approximately 120 Å.

* * * * *